(12) United States Patent
Zmora et al.

(10) Patent No.: US 7,982,521 B2
(45) Date of Patent: Jul. 19, 2011

(54) DEVICE AND SYSTEM FOR REDUCING NOISE INDUCED ERRORS

(75) Inventors: Eitan Zmora, Jerusalem (IL); Hagai David, Hof Ashkelon (IL)

(73) Assignee: Freescale Semiconductor, Inc., Austin, TX (US)

(*) Notice: Subject to any disclaimer, the term of this patent is extended or adjusted under 35 U.S.C. 154(b) by 179 days.

(21) Appl. No.: 12/444,063

(22) PCT Filed: Oct. 3, 2006

(86) PCT No.: PCT/IB2006/053610
§ 371 (c)(1),
(2), (4) Date: Apr. 2, 2009

(87) PCT Pub. No.: WO2008/041058
PCT Pub. Date: Apr. 10, 2008

(65) Prior Publication Data
US 2010/0097115 A1 Apr. 22, 2010

(51) Int. Cl.
*H03L 5/00* (2006.01)
(52) U.S. Cl. .................... 327/310; 327/328

(58) Field of Classification Search .......... 327/327, 327/328, 309–312, 317, 318
See application file for complete search history.

(56) References Cited

U.S. PATENT DOCUMENTS

| 5,557,225 | A | * | 9/1996 | Denham et al. ........... 327/199 |
| 5,617,055 | A | * | 4/1997 | Confalonieri et al. ..... 327/404 |
| 6,279,145 | B1 | | 8/2001 | Wong |
| 6,552,576 | B1 | * | 4/2003 | Bobba et al. ............... 326/113 |
| 6,603,333 | B2 | | 8/2003 | Vinh et al. |

FOREIGN PATENT DOCUMENTS
JP 2001127612 A 5/2001
* cited by examiner

*Primary Examiner* — Hai L Nguyen

(57) ABSTRACT

A method and a device for reducing noise induced errors. The device includes: a latch that includes a latch input node; a voltage limiting transfer circuit connected between a first input node and between the latch; wherein the voltage limiting transfer circuit is adapted to selectively transfer an input signal from the first input node to the latch during transfer mode; and to prevent a transfer of an input signal from the first input node to the latch by limiting voltage levels developed in the voltage limiting transfer circuit to a predefined range.

20 Claims, 5 Drawing Sheets

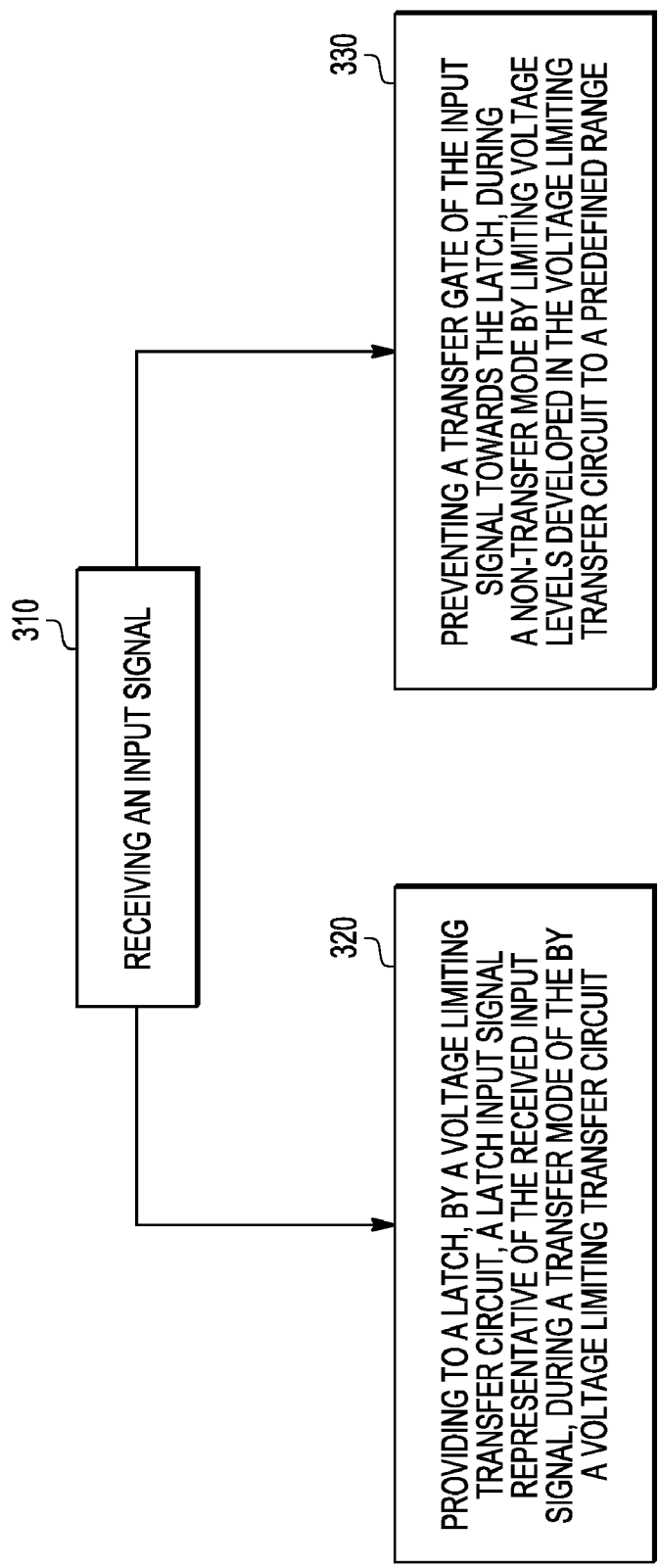

DEVICE AND SYSTEM FOR REDUCING NOISE INDUCED ERRORS

FIELD OF THE INVENTION

The present invention relates to a device and a method for reducing noise induced errors.

BACKGROUND OF THE INVENTION

High speed logic circuits such as but not limited to latches or flip-flops are required to respond to input signals very quickly. An input signal is provided to such a logic circuit via a fast transfer gate that ideally allows the input signal to propagate towards the logic circuit only during a transparent mode while preventing the input signal to reach the logic circuit during a non-transparent mode.

Typically, multiple transfer gates receive signals that were not intended to be provided to them (via parasitic capacitors also referred to as coupling capacitors) and such signals can affect signals on transfer gate input.

This unwanted influence can cause an input signal to propagate through the transfer gate even if the transfer gate is in a non-transparent mode. These unwanted influence can, for example cause voltage drops below zero volts or even below negative values that their absolute values equal the power supply level. This unwanted influence can cause a voltage peak that exceeds the level of the power supply. Such voltage drops or rise can open transfer gates that are supposed to be in a non-transfer mode.

FIG. 1 illustrates a prior art circuit 10 that includes three nodes N1 21, N2 22 and N3 23 that are connected to each other by parasitic capacitor C12 11 and C23 12. Data signal D1 80 is provided via first node N1 21 to first transfer gate 30. Nodes N2 22 and N3 23 are connected to a transfer gate and a latch which are not shown for convenience of explanation.

First transfer gate 30 includes first NMOS transistor 32 and first PMOS transistor 34. The source of PMOS transistor 34 and the drain of transistor 32 are connected to each other, the gate of first NMOS transistor 32 receives clock signal CLK 70 while the gate of first PMOS transistor 34 receives inverted clock signal CLK_INV 72. Inverted clock signal 72 is provided by clock signal inverter 56 that receives as input clock signal CLK 70.

The output of first transfer gate 30 is connected to input node 62 of first inverter 52. Input node 62 of first inverter 52 is connected to an output of second transfer gate 46. The input node of second transfer gate 40 is connected to an output of second inverter 54. The input of second inverter 54 is connected to the output of first inverter 52 and to output node 64 of latch 50.

Second transfer gate 46 includes second PMOS transistor 42 and second NMOS transistor 44. The source and drains of transistors 42 and 44 are connected to each other, the gate of second PMOS transistor 42 receives clock signal CLK 70 while the gate of second NMOS transistor 44 receives inverted clock signal CLK_INV 70.

Ideally, when clock signal CLK 70 is high first transfer gate 30 is in a non-transparent mode. When clock signal CLK70 input data signal 80 is not expected to change. Nevertheless, if the voltage at second node N2 22 or third nodes N3 33 changes (for example from "0" to "1" or from "1" to "0") these changes can cause temporary changes in the voltage at first node 21 can cause one of the transfer gate transistor to conduct and to cause changes in the data stored in latch 50. These temporary changes may change the state of latch 50.

When transfer gate 30 is in a non-transfer mode the gate NMOS transistor 32 receives zero volts. If the voltage at first node N2 22 (Vsource) is equal −Vtn (wherein Vtn is the threshold voltage of NMOS transistor 32) then the voltage drop between the source and gate of NMOS transistor 32 is equal to Vtn (Vgs=Vgate−Vsource=0−(−Vtn)=Vtn) and the NMOS transistor 32 conducts. If the voltage at node N2 22 is below −Vtn then the Vgs exceeds Vtn and NMOS transistor 32 conducts.

When transfer gate 30 is in a non-transfer mode the gate PMOS transistor 34 receives a high level voltage that is referred to as Vdd. If the voltage at first node N2 22 (Vsource) equals Vdd+Vtp (wherein Vtp is the threshold voltage of PMOS transistor 34) then the voltage drop between the source and gate of PMOS transistor 34 equals Vtp (Vgs=Vsource−Vgate=(Vdd+Vdd)−Vdd=Vtp) and the PMOS transistor 34 conducts. If the voltage at node N2 22 exceeds (Vdd+Vtp) then Vgs exceeds Vtp and PMOS transistor 34 conducts.

In some cases the transfer gate is preceded by a logical gate. Placing a logical gate near the transfer gate reduces the coupling capacitance but slows the circuit. An exemplary circuit that includes such as logic gate is illustrated in FIG. 2.

FIG. 2 illustrates a prior art circuit 11 that includes OR logic gate 90, first transfer gate 30, clock signal inverter 56, second transfer gate 46, first inverter 50, second inverter 54, and AND logic gate 94.

OR logic gate 90 performs an OR operation between a scan enable signal SE 91 and a clock control signal EN 99 that has to pass through a fast critical path.

AND logic gate 94 performs an AND operation between clock signal CLK 70 and the data signal at the input of first inverter 50. The output of AND logic gate 94 is the output signal of circuit 11. Circuit 11 is adapted to receive a clock signal and to provide a gated clock signal 95 to another circuit. Circuit 11 as well as circuit 10 is susceptible to errors caused by noise.

There is a need to provide an efficient method and device for reducing noise induced errors.

SUMMARY OF THE PRESENT INVENTION

A device and a method for reducing noise induced errors, as described in the accompanying claims.

BRIEF DESCRIPTION OF THE DRAWINGS

The present invention will be understood and appreciated more fully from the following detailed description taken in conjunction with the drawings in which:

FIG. 5 is a flow chart of a method for reducing noise induced errors, according to an embodiment of the invention.

DETAILED DESCRIPTION OF PREFERRED EMBODIMENTS

The following figures illustrate exemplary embodiments of the invention. They are not intended to limit the scope of the invention but rather assist in understanding some of the embodiments of the invention. It is further noted that all the figures are out of scale.

A device and method for reducing noise induced errors is provided. The method and system limit voltage levels between a limiting voltage transfer circuit so that undershoots and overshoots do not open at least output transistors when the voltage limiting transfer circuit is in a non-transfer mode.

The device includes: a latch that has a latch input node and a voltage limiting transfer circuit that is connected between a first input node and between the latch. The voltage limiting transfer circuit is adapted to selectively transfer an input signal from the first input node to the latch during transfer mode; and to prevent a transfer of an input signal from the first input node to the latch by limiting voltage levels developed in the voltage limiting transfer circuit to a predefined range.

The method includes: receiving an input signal; providing to a latch, by a voltage limiting transfer circuit, a latch input signal representative of the received input signal, during a transfer mode; and preventing a transfer gate of the input signal towards the latch, during a non-transfer mode, by limiting voltage levels developed in the voltage limiting transfer circuit to a predefined range.

Figure 3:
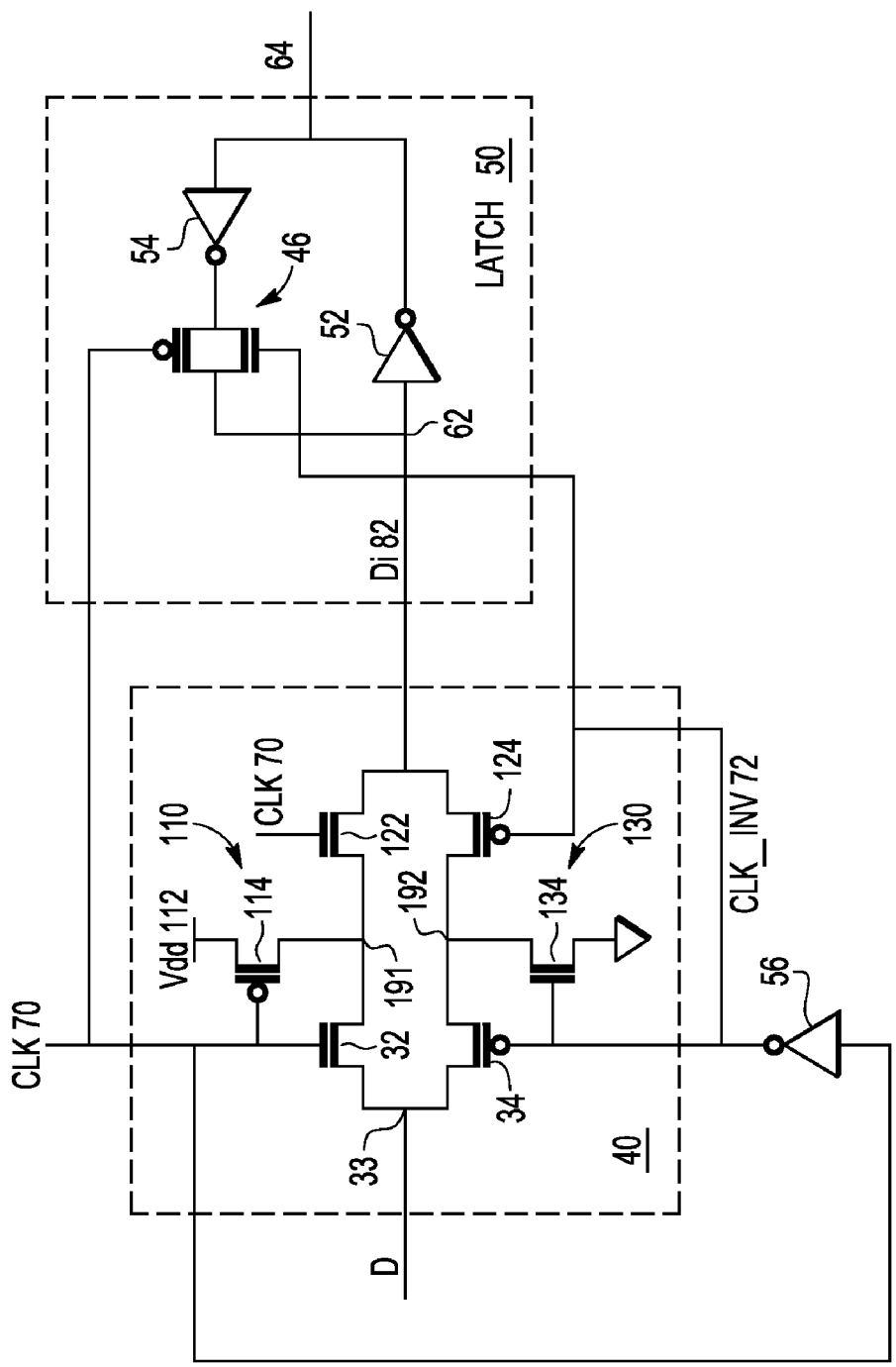
FIG. 3 illustrates a device, according to an embodiment of the invention.

FIG. 3 illustrates device 101, according to an embodiment of the invention. Device 100 can be a mobile phone, a personal data accessory, a media player, a laptop computer, a desktop computer, a server, a vehicle control unit, and the like.

Device 101 can include many components and can also include multiple integrated circuits. In a typical integrated circuit there are various critical paths that should be very fast. These critical paths can include high speed logic gates such as latches, flip-flops and the like. For simplicity of explanation FIG. 3 illustrates a single latch (latch 50) and a single voltage limiting transfer circuit (voltage limiting transfer circuit 40).

Voltage limiting transfer circuit 40 is connected between a first input node 33 and between latch 50. Voltage limiting transfer circuit 40 is adapted to selectively transfer an input signal from first input node 33 to latch 50 during transfer mode and to prevent a transfer of an input signal from the first input node 33 to latch 50 by limiting voltage levels developed in the voltage limiting transfer circuit 40 to a predefined range. The predefined range does not include voltage levels that can cause a transistor to be opened by overshoot or by undershoot.

Device 101 also includes nodes N2 22 and N3 23, but for simplicity of explanation they are not shown.

Device 101 includes: latch 50, voltage limiting transfer circuit 40, and clock signal inverter 56. Latch 50 includes first and second inverters 52 and 54 and second transfer gate 46. Voltage limiting transfer circuit 40 includes: first PMOS transistor 34, first NMOS transistor 32, output PMOS transistor 124, output NMOS transistor 122, pull up circuit 110 and pull down circuit 120.

First NMOS transistor 32 is connected between first input node 33 and between a first intermediate node 191. Output NMOS transistor 122 is connected between first intermediate node 191 and between the input node 62 of latch 50. Pull up circuit 110 is connected to the first intermediate node 191. Pull up circuit 110 includes a pull up PMOS transistor 114 that is connected between first intermediate node 191 and a supply source 112. The gate of pull up PMOS transistor 114 receives clock signal CLK 70.

First PMOS transistor 34 is connected between first input node 33 and between second intermediate node 192. Output PMOS transistor 124 is connected between second intermediate node 192 and between the input node 62 of latch 50. Pull down circuit 130 is connected to second intermediate node 192. Pull down circuit 113 includes a pull down NMOS transistor 134 that is connected between second intermediate node 192 and the ground. The gate of pull down NMOS transistor 134 receives inverted clock signal CLK_INV 72.

The input of first inverter 52 and the output of second transfer gate 46 are connected to input node 62. The input of second inverter 54 is connected to the output of first inverter 52 and to output node 64 of latch 50.

When voltage limiting transfer circuit 40 is in a non-transfer mode pull up circuit 110 and pull down circuit 130 is activated. Even if NMOS transistor 32 conducts pull up circuit 110 prevents output NMOS transistor 122 from conducting. Even if PMOS transistor 34 conducts pull down circuit 130 prevents output PMOS transistor 124 from conducting. Accordingly, the input signal does not reach latch 50.

Conveniently, voltage limiting transfer circuit 40 is much faster than a combination of inverter followed by a transfer gate.

Figure 4:
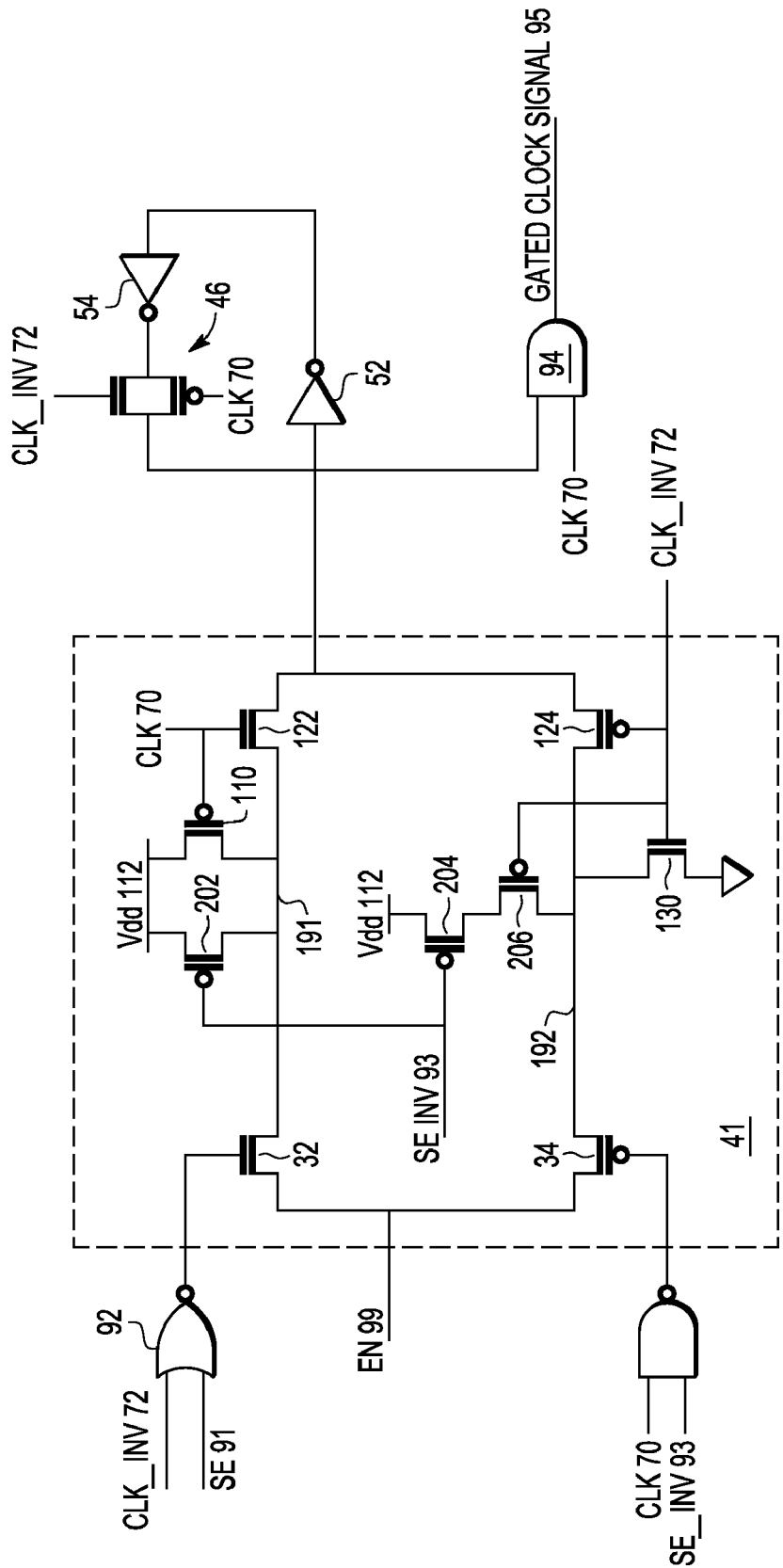
FIG. 4 illustrates a device, according to an embodiment of the invention.

FIG. 4 illustrates device 102, according to an embodiment of the invention.

Figure 1:
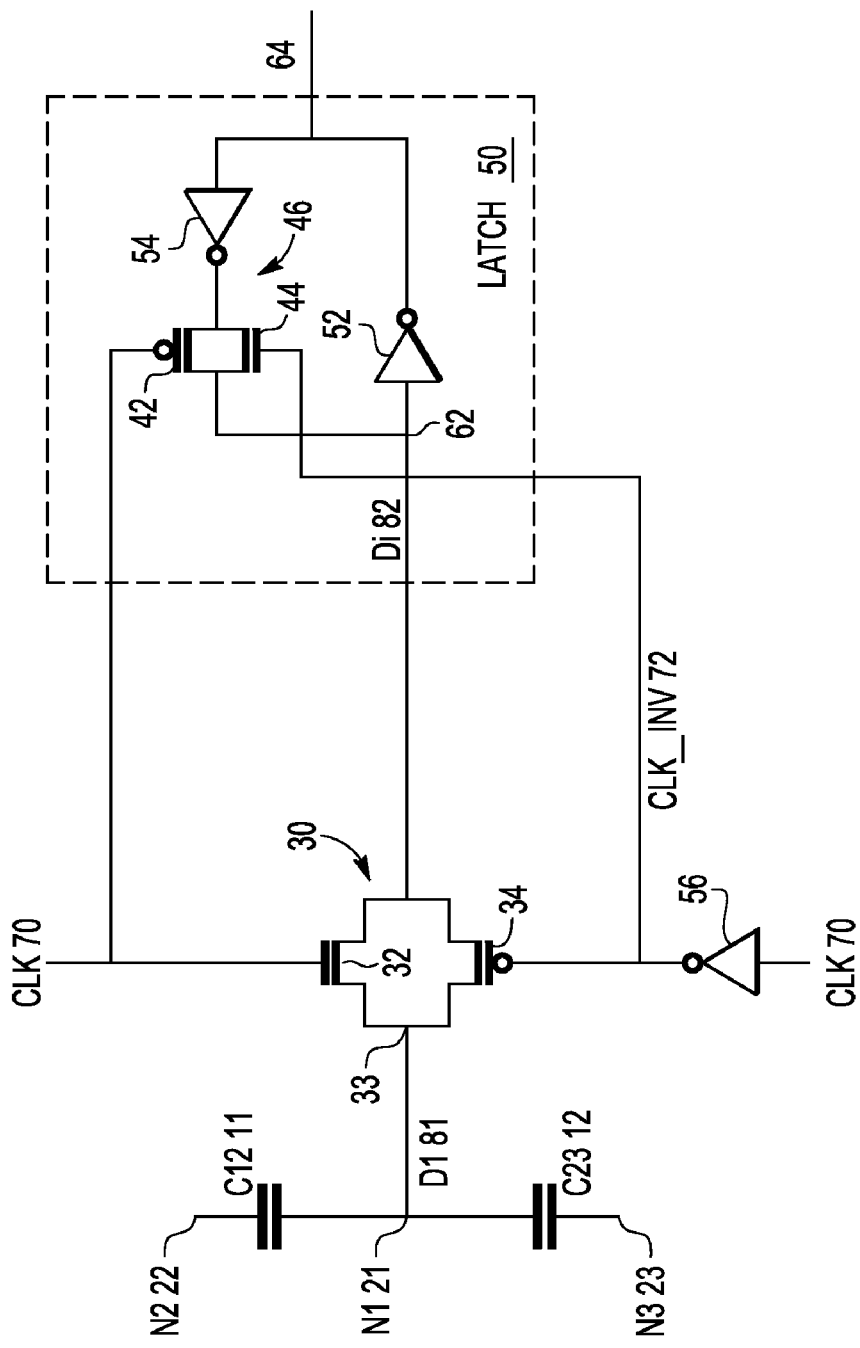
FIG. 1 illustrates a prior art circuit.
Figure 2:
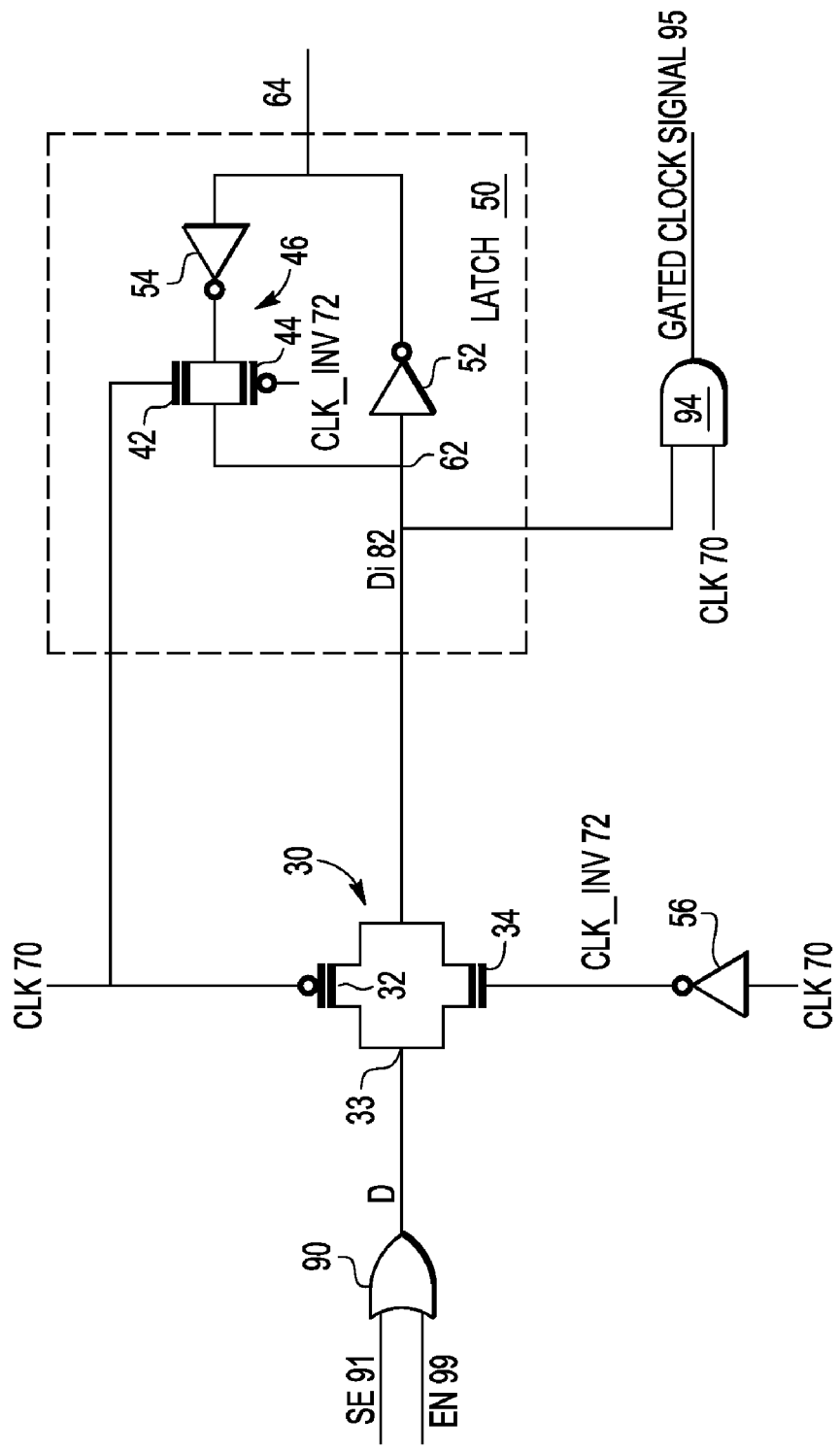
FIG. 2 illustrates a prior art circuit.

A high speed implementation of the OR logic gate 90 of FIG. 2 requires to use a transfer gate, thus it is susceptible to noise as previously explained. Device 102 of FIG. 4 provides a combination of fast logic and noise protected transfer gate. The EN 99 signal which is timely critical passes directly through the voltage limiting circuit.

OR logic gate 90 of FIG. 2 was replaced by NOR logic gate 92, NAND logic gate 96, and by an inverter that is integrated in voltage limiting transfer circuit 41. This inverter is implemented by various transistors such as additional transistors 202-206. The circuit show in FIG. 4 is used as standard library cell, thus simplifying the use of the invention in standard design.

Device 102 includes: latch 50, voltage limiting transfer circuit 41, clock signal inverter 56, NOR logic gate 92 and NAND logic gate 96. Voltage limiting transfer circuit 41 of FIG. 4 includes the components of voltage limiting transfer circuit 40 and three additional transistors 202-206.

First additional transistor 202 is connected in parallel to pull up transistor 114. The source of the first and second additional transistors 202 and 204 are connected to supply source 290. The gates of the first and second additional circuits 202 and 204 are connected to each other are receive an inverted scan enable signal SE_INV 93. The drain of first additional transistor 202 is connected to first intermediate node 191. The drain of third additional transistor 206 is connected to second intermediate node 192. The drain of second additional transistor 204 is connected to the source of third additional transistor 206. The gate of third additional transistor 206 receives an inverted clock signal CLK_INV 72.

The inputs of NOR logic gate 92 are CLK_INV 72 and an inverted scan enable signal SE_INV 93. The output of NOR logic gate 92 is connected to the gate of first NMOS transistor 32. The inputs of NAND logic gate 96 are CLK 70 and scan enable signal SE 91. The output of NAND logic gate 96 is connected to the gate of first PMOS transistor 34.

First input node 33 receives clock control signal EN 99.

When clock CLK 70 is high and either one of clock control signal EN 99 or scan enable signal SE 91 are high then the voltage limiting transfer circuit 41 outputs a high level signal to latch 50.

FIG. 5 illustrates method 300 for reducing noise induced errors, according to an embodiment of the invention.

Method 300 starts by stage 310 of receiving an input signal. Stage 310 is followed by stages 320 and 330.

Stage 320 includes providing to a latch, by a voltage limiting transfer circuit, a latch input signal representative of the received input signal, during a transfer mode of a voltage limiting transfer circuit.

Stage 330 includes preventing a transfer gate of the input signal towards the latch, during a non-transfer mode by limiting voltage levels developed in the voltage limiting transfer circuit to a predefined range.

Conveniently stage 330 includes utilizing one or more pull up circuit and one or more pull down circuit.

Conveniently, stage 330 includes limiting voltage levels developed at an input node of an output PMOS transistor of the voltage limiting transfer circuit to positive voltages.

Conveniently, stage 330 includes limiting voltage levels developed at an input node of an output NMOS transistor of the voltage limiting transfer circuit to negative voltages.

According to an embodiment of the invention the device that applies method 300 is designed by a designing stage that includes designing the voltage limiting transfer gate from a standard cell library.

Conveniently, stage 320 comprises inverting the received input signal.

According to an embodiment of the invention method 300 is utilized for generating a gated clock signal. The received input signal can be a clock signal and a clock enable signal and the output signal is a gated clock signal.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A device for reducing noise induced errors, the device comprises:
   a latch that comprises a latch input node; and
   a voltage limiting transfer circuit coupled between a first input node and the latch, the voltage limiting transfer circuit adapted to selectively transfer an input signal from the first input node to the latch during transfer mode, and to prevent a transfer of an input signal from the first input node to the latch by limiting voltage levels developed in the voltage limiting transfer circuit to a predefined range, wherein the voltage limiting transfer circuit comprises:
   a first transistor;
   a second transistor; and
   a third transistor, wherein:
   a source of the first and second transistors are coupled to a supply source;
   gates of the first and second transistors are coupled to each other and are adapted to receive an inverted scan enable signal;
   a drain of the first transistor is coupled to a first intermediate node;
   a drain of the third transistor is coupled to a second intermediate node;
   a drain of the second transistor is coupled to a source of the third transistor; and
   a gate of the third transistor receives an inverted clock signal.

2. The device according to claim 1 further comprising multiple additional transistors, adapted to perform an inversion operation.

3. The device according to claim 1 wherein the voltage limiting transfer circuit is faster than an inverter coupled to a transfer gate.

4. The device according to claim 1 wherein the input signal is a clock signal and wherein an output signal of the device is a gated clock signal.

5. The device according to claim 1 wherein the voltage limiting transfer circuit further comprises:
   a first NMOS transistor coupled between the first input node and the first intermediate node;
   an output NMOS transistor coupled between the first intermediate node and the input node of the latch; and
   a pull up circuit coupled to the first intermediate node.

6. The device according to claim 1 wherein the voltage limiting transfer circuit further comprises:
   a first PMOS transistor coupled between the first input node and the second intermediate node;
   an output PMOS transistor coupled between the second intermediate node and the input node of the latch; and
   a pull down circuit coupled to the second intermediate node.

7. The device according to claim 1 wherein the voltage limiting transfer circuit further comprises at least one pull up circuit and at least one pull down circuit adapted to limit voltage levels developed in the voltage limiting transfer circuit when the voltage limiting transfer circuit is in a non-transfer mode.

8. The device according to claim 7 wherein the voltage limiting transfer circuit further comprises:
   a first NMOS transistor coupled between the first input node and the first intermediate node;
   an output NMOS transistor coupled between the first intermediate node and the input node of the latch; and
   a pull up circuit coupled to the first intermediate node.

9. The device according to claim 7 wherein the voltage limiting transfer circuit further comprises:
   a first PMOS transistor coupled between the first input node and the second intermediate node;
   an output PMOS transistor coupled between the second intermediate node and the input node of the latch; and
   a pull down circuit coupled to the second intermediate node.

10. The device according to claim 7 wherein the pull down circuit is adapted to limit voltage levels developed at the second intermediate node to negative voltages, the second intermediate node coupled to an input of an output PMOS transistor of the voltage limiting transfer circuit.

11. The device according to claim 7 wherein the pull up circuit is adapted to limit voltage levels developed at the first intermediate node to positive voltages, the first intermediate node coupled to an input of an output NMOS transistor of the voltage limiting transfer circuit.

12. The device according to claim 11 wherein the pull down circuit is adapted to limit voltage levels developed at the second intermediate node to negative voltages, the second intermediate node coupled to an input of an output PMOS transistor of the voltage limiting transfer circuit.

13. A method for reducing noise induced errors, the method comprises:
   receiving an input signal;
   providing to a latch, by a voltage limiting transfer circuit, a latch input signal representative of the received input signal, during a transfer mode; and
   preventing a transfer of the input signal towards the latch, during a non-transfer mode, by limiting voltage levels developed in the voltage limiting transfer circuit to a predefined range, the voltage limiting transfer circuit comprising:
   a first transistor;
   a second transistor; and
   a third transistor, wherein:
   a source of the first and second transistors are coupled to a supply source;

gates of the first and second transistors are coupled to each other and are adapted to receive an inverted scan enable signal;

a drain of the first transistor is coupled to a first intermediate node;

a drain of the third transistor is coupled to a second intermediate node;

a drain of the second transistor is coupled to a source of the third transistor; and a gate of the third transistor receives an inverted clock signal.

14. The method according to claim 13 wherein the preventing comprises utilizing at least one pull up circuit and at least one pull down circuit.

15. The method according to claim 14 wherein the preventing comprises limiting voltage levels developed at the first intermediate node to positive voltages, the first intermediate node coupled to an input of an output NMOS transistor of the voltage limiting transfer circuit.

16. The method according to claim 15 wherein the preventing comprises limiting voltage levels developed at the second intermediate node to negative voltages, the second intermediate node coupled to an input of an output PMOS transistor of the voltage limiting transfer circuit.

17. The method according to claim 13 wherein the providing includes inverting the input signal during a transfer gate node.

18. The method according to claim 13 further comprising generating a gated clock signal.

19. The method according to claim 13 wherein the voltage limiting transfer circuit further comprises:

a first NMOS transistor coupled between the first input node and the first intermediate node;

an output NMOS transistor coupled between the first intermediate node and the input node of the latch; and a pull up circuit coupled to the first intermediate node.

20. The method according to claim 13 wherein the voltage limiting transfer circuit further comprises:

a first PMOS transistor coupled between the first input node and the second intermediate node;

an output PMOS transistor coupled between the second intermediate node and the input node of the latch; and a pull down circuit coupled to the second intermediate node.

* * * * *